(12) United States Patent
Seki

(10) Patent No.: US 12,294,133 B2
(45) Date of Patent: May 6, 2025

(54) DIRECTIONAL COUPLER

(71) Applicant: Murata Manufacturing Co., Ltd., Kyoto (JP)

(72) Inventor: Kenta Seki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 196 days.

(21) Appl. No.: 18/153,407

(22) Filed: Jan. 12, 2023

(65) Prior Publication Data

US 2023/0178870 A1    Jun. 8, 2023

Related U.S. Application Data

(63) Continuation of application No. PCT/JP2021/026286, filed on Jul. 13, 2021.

(30) Foreign Application Priority Data

Jul. 21, 2020  (JP) .................................. 2020-124712

(51) Int. Cl.
| | |
|---|---|
| *H01P 5/18* | (2006.01) |
| *H01P 1/10* | (2006.01) |
| *H01P 1/12* | (2006.01) |
| *H01P 1/213* | (2006.01) |
| *H03H 7/01* | (2006.01) |

(52) U.S. Cl.
CPC ................ *H01P 5/18* (2013.01); *H01P 1/127* (2013.01); *H01P 1/213* (2013.01); *H03H 7/0161* (2013.01)

(58) Field of Classification Search
CPC .......... H01P 5/187; H01P 1/213; H01P 1/127; H01P 5/184; H01P 5/18
USPC ......... 333/101, 109, 110, 112, 116, 118, 262
See application file for complete search history.

(56) References Cited

U.S. PATENT DOCUMENTS

| | | |
|---|---|---|
| 2017/0230066 A1 | 8/2017 | Little et al. |
| 2018/0062672 A1 | 3/2018 | Kim |
| 2019/0097297 A1 | 3/2019 | Ishihara |
| 2021/0013858 A1 | 1/2021 | Tokuda et al. |

FOREIGN PATENT DOCUMENTS

| | | |
|---|---|---|
| JP | 2018-037780 A | 3/2018 |
| JP | 2019-062309 A | 4/2019 |
| WO | 2019/189232 A1 | 10/2019 |

OTHER PUBLICATIONS

International Search Report for PCT/JP2021/026286 dated Oct. 19, 2021.

*Primary Examiner* — Rakesh B Patel

(74) *Attorney, Agent, or Firm* — McDonald Hopkins LLC

(57) ABSTRACT

A directional coupler includes a main line, a sub line electromagnetically coupled to the main line, a coupling output terminal connected to one end of the sub line, a filter connected between the one end of the sub line and the coupling output terminal, and a filter with a pass band higher than a pass band of the filter. One end of the filter is connected to the coupling output terminal. Another end of the filter is terminated.

19 Claims, 11 Drawing Sheets

DIRECTIONAL COUPLER

CROSS REFERENCE TO RELATED APPLICATION

This is a continuation of International Application No. PCT/JP2021/026286 filed on Jul. 13, 2021 which claims priority from Japanese Patent Application No. 2020-124712 filed on Jul. 21, 2020. The contents of these applications are incorporated herein by reference in their entireties.

BACKGROUND OF THE DISCLOSURE

Field of the Disclosure

The present disclosure relates to a directional coupler.

Description of the Related Art

For example, Patent Document 1 describes a directional coupler including a main line and a sub line. A variable filter circuit including multiple filters is connected between the sub line and a coupling port of the directional coupler.

Patent Document 1: International Publication No. 2019/189232

BRIEF SUMMARY OF THE DISCLOSURE

With the related-art directional coupler, a desired signal can be obtained from the coupling port with a certain degree of accuracy by using a filter that passes only the desired signal. However, when a detector is connected to the coupling port, a distortion component, such as a harmonic wave, of an input desired signal is generated at the detector. The distortion component returns to the filter via the coupling port and is reflected by the filter. The distortion component reflected by the filter enters the detector again and reduces the detection accuracy.

For the above reason, one possible benefit of the present disclosure is to provide a directional coupler that can improve the detection accuracy of a detector connected to the directional coupler.

A directional coupler according to an embodiment of the present disclosure includes a main line, a sub line electromagnetically coupled to the main line, an output terminal connected to one end of the sub line, a first filter connected between the one end of the sub line and the output terminal, and a second filter with a pass band higher than a pass band of the first filter. One end of the second filter is connected to the output terminal, and another end of the second filter is terminated.

A directional coupler according to the present disclosure can improve the detection accuracy of a detector when the detector is connected to the directional coupler.

DETAILED DESCRIPTION OF THE DISCLOSURE

Figure 1:
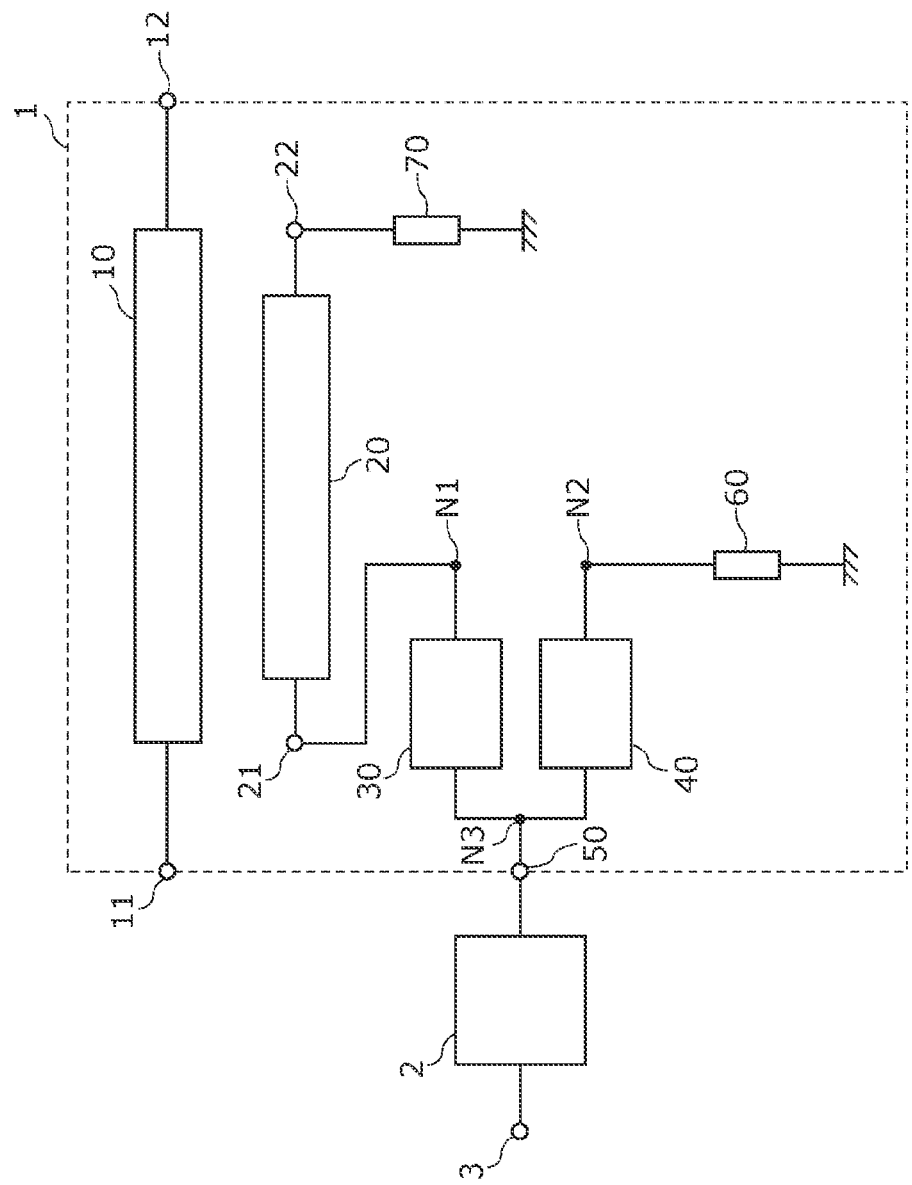
FIG. 1 is a drawing illustrating a configuration of a directional coupler according to a first embodiment.

Below, directional couplers according to embodiments of the present disclosure are described in detail with reference to the drawings. All of the embodiments described below are specific examples of the present disclosure. Accordingly, values, shapes, materials, components, arrangements of components, connection configurations, steps, orders of steps, etc. used in the embodiments below are examples and are not intended to limit the present disclosure. Therefore, among the components in the embodiments below, components not described in the independent claims are described as optional components.

Each of the drawings is a schematic diagram and does not necessarily illustrate a precise configuration. For example, the scale of each drawing does not necessarily match the actual scale. Also, the same reference numbers are assigned to substantially the same components in the drawings, and overlapping descriptions of those components are omitted or simplified.

In this application, terms such as "match" and "equal" indicating the relationships between elements and numerical ranges are not only used in their strict meaning but may also indicate substantially the same ranges, such as ranges that differ by a few percent.

Also, in the descriptions of the circuit configurations of the present disclosure, "directly connected" means that a circuit element is directly connected to a component using a connection terminal and/or a wire conductor without another circuit element interposed therebetween. In contrast, "connected" not only indicates a case in which a circuit element is directly connected using a connection terminal and a wire conductor but also indicates a case in which the circuit element is electrically connected via another circuit element. Furthermore, "connected between A and B" means that a component is disposed between A and B and connected to both of A and B.

First Embodiment

[1-1. Configuration]

First, a configuration of a directional coupler according to a first embodiment is described with reference to FIG. 1. FIG. 1 is a drawing illustrating a configuration of a directional coupler 1 according to the present embodiment.

As illustrated in FIG. 1, the directional coupler 1 includes a main line 10, a sub line 20, a filter 30, a filter 40, a coupling output terminal 50, and termination circuits 60 and 70. The directional coupler 1 is provided to cause a detector 2 to detect a radio frequency signal transmitted through the main line 10.

The main line 10 includes two input-output terminals 11 and 12. The input-output terminal 11 is connected to at least one of a transmitter circuit that generates a radio frequency signal to be transmitted and a receiver circuit that processes a radio frequency signal received by an antenna. The input-output terminal 12 is connected to an antenna. Alternatively, the input-output terminal 11 may be connected to the antenna, and the input-output terminal 12 may be connected to the transmitter circuit or the receiver circuit.

The sub line 20 is electromagnetically coupled to the main line 10. The sub line 20 includes an end 21 and another end 22. The end 21 is connected via the filter 30 to the coupling output terminal 50. The end 22 is connected to the termination circuit 70.

The filter 30 is an example of a first filter and is connected between the end 21 of the sub line 20 and the coupling output terminal 50. A node N1, which is an end of the filter 30, is connected to the end 21 of the sub line 20. A node N3, which is another end of the filter 30, is connected to the coupling output terminal 50.

The filter 30 has a predetermined pass band and is configured to transmit a desired signal. Specifically, the filter 30 transmits a signal with a target frequency to be detected by the detector 2.

The filter 40 is an example of a second filter and is connected between the coupling output terminal 50 and the ground. The node N3, which is an end of the filter 40, is connected to the coupling output terminal 50. A node N2, which is another end of the filter 40, is terminated. Specifically, the node N2 of the filter 40 is connected to the ground via the termination circuit 60.

The filter 40 has a pass band that is higher than the pass band of the filter 30. Specifically, the filter 40 transmits a signal in a harmonic band of the target frequency to be detected by the detector 2. The filter 40 may have any pass band including a pass band higher than the pass band of the filter 30. As described later, the filter 40 may be a band-pass filter or a high-pass filter having a pass band higher than the pass band of the filter 30, or may be a band-elimination filter that blocks only the pass band of the filter 30.

The filters 30 and 40 may constitute a diplexer. In this case, the node N3 is a common terminal of the diplexer, and the nodes N1 and N2 are branching input-output terminals. In the diplexer, frequency bands that can pass through the respective branching input-output terminals are, for example, in a complementary relationship. Specific configurations and examples of the frequency characteristics of the filters 30 and 40 are described later.

The coupling output terminal 50 is an example of an "output terminal" and is connected to the end 21 of the sub line 20. Specifically, the coupling output terminal 50 is connected to the end 21 of the sub line 20 via the filter 30. Also, the coupling output terminal 50 is connected to the ground via the filter 40 and the termination circuit 60. The detector 2 is connected to the coupling output terminal 50.

The termination circuit 60 is connected to the node N2 of the filter 40. The impedance of the termination circuit 60 is adjusted to a predetermined value so that a signal passed through the filter 40 can be absorbed and consumed. Specifically, the impedance of the termination circuit 60 is adjusted to an appropriate value so as to absorb and consume a distorted signal 92 (see FIG. 7) generated in the detector 2.

The termination circuit 70 is connected to the end 22 of the sub line 20. The impedance of the termination circuit 70 is adjusted to a predetermined value so as to be able to absorb and consume a signal, among radio frequency signals transmitted through the main line 10, that has a fundamental frequency f0 and is reflected from the input-output terminal 12 to the input-output terminal 11. The termination circuit 70 is, for example, a 50 Ω resistor.

The directional coupler 1 configured as described above is used to detect a radio frequency signal transmitted through the main line 10. For example, the radio frequency signal conforms to a communication standard such as Wi-Fi (registered trademark), Long Term Evolution (LTE), or 5th generation (5G). The directional coupler 1 is provided, for example, in the front end of a multimode/multiband mobile phone.

Some of radio frequency signals transmitted through the main line 10 are inputted to the detector 2 via the sub line 20, the filter 30, and the coupling output terminal 50. The detector 2 detects, for example, the signal power of an input signal and outputs a detection result from a detection result output terminal 3.

The detection result output terminal 3 is connected to, for example, a transmitter circuit, a receiver circuit, or a control circuit for the transmitter circuit or the receiver circuit. For example, this makes it possible to control the amplification factor of an amplifier provided in the transmitter circuit or the receiver circuit. Improving detection accuracy makes it possible to improve the accuracy and reliability of various control operations.

[1-2. Configurations and Frequency Characteristics of Filters]

Next, examples of the configurations and frequency characteristics of the filters 30 and 40 are described with reference to FIG. 2 and FIG. 3.

Figure 2:
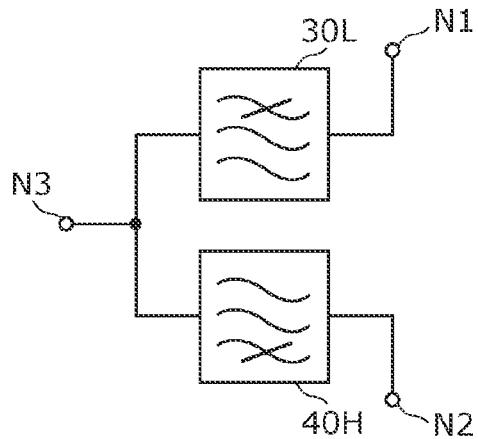
FIG. 2 is a drawing illustrating the examples of the configurations of multiple filters provided in the directional coupler according to the first embodiment.

FIG. 2 is a drawing illustrating the examples of the configurations of multiple filters provided in the directional coupler 1 according to the present embodiment. A low-pass filter 30L illustrated in FIG. 2 is an example of the filter 30 illustrated in FIG. 1. A high-pass filter 40H is an example of the filter 40 illustrated in FIG. 1. The low-pass filter 30L and the high-pass filter 40H constitute, for example, a diplexer.

Figure 3:
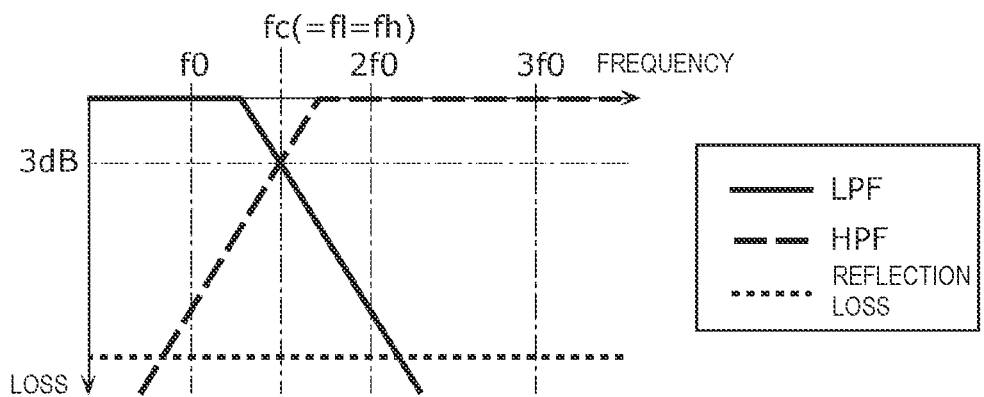
FIG. 3 is a drawing showing the insertion loss characteristics of the respective filters illustrated in FIG. 2.

FIG. 3 is a drawing showing the insertion loss characteristics of the respective filters illustrated in FIG. 2. In FIG. 3, the horizontal axis indicates the frequency and the vertical axis indicates the insertion loss. The thick solid line in FIG. 3 indicates the frequency characteristics of the insertion loss of the low-pass filter 30L. The thick dashed line indicates the frequency characteristics of the insertion loss of the high-pass filter 40H. The thick dotted line indicates the frequency characteristics of the return loss of the low-pass filter 30L and the high-pass filter 40H observed at the node N3.

As illustrated in FIG. 3, the low-pass filter 30L transmits a signal with a frequency less than or equal to a frequency f1 and blocks a signal with a frequency greater than the frequency f1. The frequency f1 is the corner frequency of the low-pass filter 30L. The low-pass filter 30L has a pass band that is less than or equal to the frequency f1.

The corner frequency is also referred to as a rejection frequency or a cutoff frequency. The corner frequency corresponds to a frequency at which the insertion loss becomes about 3 dB in the frequency characteristics of the low-pass filter 30L. The corner frequency is used in the same meaning in the descriptions of a high-pass filter, a band-pass filter, and a band-elimination filter below.

The high-pass filter 40H transmits a signal with a frequency greater than or equal to a frequency fh and blocks a signal with a frequency less than the frequency fh. The frequency fh is the corner frequency of the high-pass filter 40H. The high-pass filter 40H has a pass band that is greater than or equal to the frequency fh.

In the present embodiment, the pass bands of the low-pass filter 30L and the high-pass filter 40H are in a complementary relationship. Specifically, the corner frequency f1 of the low-pass filter 30L is equal to the corner frequency fh of the high-pass filter 40H. Here, "equal" not only indicates a perfect match but also indicates a case in which there is a difference within about 10%. That is, the corner frequency f1 of the low-pass filter 30L and the corner frequency fh of the high-pass filter 40H are not necessarily exactly the same, as long as the corner frequencies f1 and fh can be regarded as substantially the same. The same applies to a band-pass filter and a band-elimination filter described later.

Because the corner frequencies of the two filters are the same, the return loss of the two filters observed at the node N3 is suppressed to a sufficiently small level across the entire frequency band. Accordingly, a signal inputted from the node N3 to the two filters is not reflected by one of the two filters and passes through the one of the two filters. In other words, among signals inputted via the coupling output terminal 50 and the node N3 to the two filters, signals that are reflected by the two filters and return to the detector 2 via the coupling output terminal 50 are sufficiently suppressed.

As shown in FIG. 3, the corner frequency fc (=f1=fh) of the two filters is greater than the fundamental frequency f0 and less than a frequency 2f0 of a second harmonic wave. The fundamental frequency f0 is the frequency of the fundamental wave of a radio frequency signal transmitted through the main line 10. That is, the fundamental frequency f0 is the frequency (i.e., target frequency) of a signal to be detected by the detector 2. On the other hand, the frequency 2f0 of the second harmonic wave and a frequency 3f0 of a third harmonic wave are frequencies of unnecessary signals that should not be inputted to the detector 2. The fundamental frequency f0 is included in the pass band (less than or equal to f1) of the low-pass filter 30L. The frequencies 2f0 and 3f0 are included in the pass band (greater than or equal to fh) of the high-pass filter 40H.

With this configuration, among radio frequency signals inputted from the node N1, a desired signal (fundamental wave) with the fundamental frequency f0 passes through the low-pass filter 30L and is inputted to the detector 2 via the node N3 and the coupling output terminal 50. Because unnecessary signals other than the fundamental wave do not substantially pass through the low-pass filter 30L, the detection accuracy of the detector 2 can be improved.

Here, the two filters 30 and 40 provided in the directional coupler 1 are not limited to the examples illustrated in FIG. 2. For example, the filters 30 and 40 may be a band-pass filter and a band-elimination filter.

Figure 4:
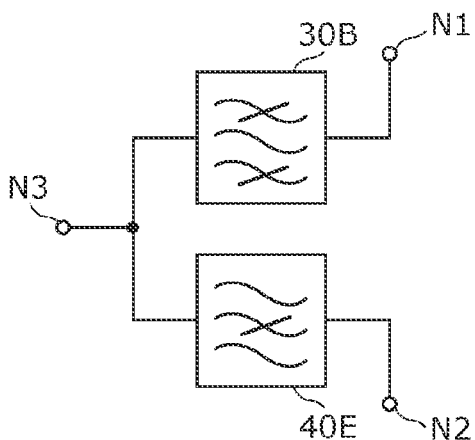
FIG. 4 is a drawing illustrating the other examples of the configurations of multiple filters provided in the directional coupler according to the first embodiment.

FIG. 4 is a drawing illustrating the other examples of the configurations of multiple filters provided in the directional coupler 1 according to the present embodiment. A band-pass filter 30B illustrated in FIG. 4 is an example of the filter 30 illustrated in FIG. 1. A band-elimination filter 40E is an example of the filter 40 illustrated in FIG. 1. The band-pass filter 30B and the band-elimination filter 40E constitute, for example, a diplexer.

Figure 5:
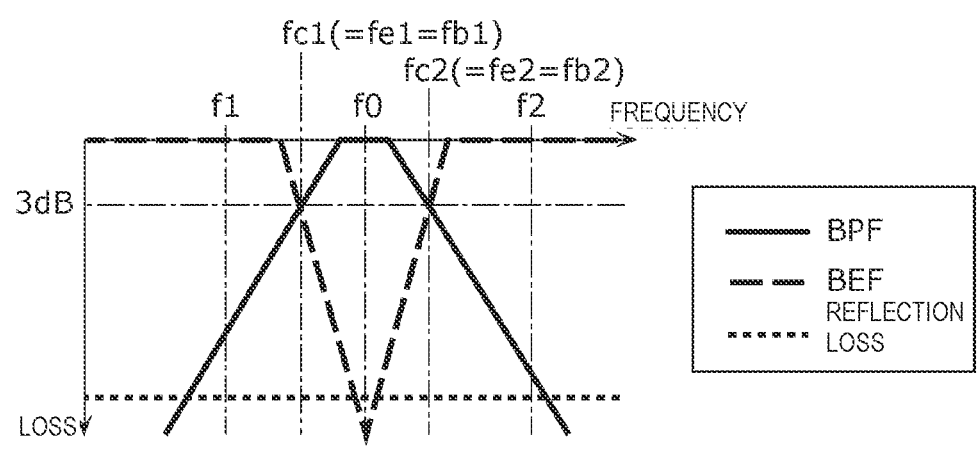
FIG. 5 is a drawing showing the insertion loss characteristics of the respective filters illustrated in FIG. 4.

FIG. 5 is a drawing showing the insertion loss characteristics of the respective filters illustrated in FIG. 4. In FIG. 4, the horizontal axis indicates the frequency and the vertical axis indicates the insertion loss. The thick solid line in FIG. 4 indicates the frequency characteristics of the insertion loss of the band-pass filter 30B. The thick dashed line indicates the frequency characteristics of the insertion loss of the band-elimination filter 40E. The thick dotted line indicates the frequency characteristics of the return loss of the band-pass filter 30B and the band-elimination filter 40E observed at the node N3.

As shown in FIG. 5, the band-pass filter 30B transmits a signal with a frequency greater than or equal to a frequency fb1 and less than or equal to a frequency fb2 and blocks a signal with a frequency less than the frequency fb1 and a signal with a frequency greater than the frequency fb2. The frequency fb1 is a lower corner frequency of the band-pass filter 30B. The frequency fb2 is a higher corner frequency of the band-pass filter 30B. The band-pass filter 30B has a pass band that is greater than or equal to fb1 and less than or equal to fb2.

The band-elimination filter 40E transmits a signal with a frequency less than or equal to a frequency fe1 and a signal with a frequency greater than or equal to a frequency fe2 and blocks a signal with a frequency greater than the frequency fe1 and less than the frequency fe2. The frequency fe1 is a lower corner frequency of the band-elimination filter 40E. The frequency fe2 is a higher corner frequency of the band-elimination filter 40E. The band-elimination filter 40E has a pass band less than or equal to the frequency fe1 and a pass band greater than or equal to the frequency fe2. One pass band (a range greater than or equal to fe2) of the band-elimination filter 40E is higher than the pass band of the band-pass filter 30B.

In the present embodiment, the pass bands of the band-pass filter 30B and the band-elimination filter 40E are in a complementary relationship. Specifically, the corner frequency fb1 of the band-pass filter 30B is equal to the corner frequency fe1 of the band-elimination filter 40E. Also, the corner frequency fb2 of the band-pass filter 30B is equal to the corner frequency fe2 of the band-elimination filter 40E.

Because the two filters have the same lower corner frequency and the same higher corner frequency, the return loss of the two filters observed at the node N3 is suppressed to a sufficiently small level across the entire frequency band. Accordingly, among signals inputted via the coupling output terminal 50 and the node N3 to the two filters, signals that are reflected by the two filters and return to the detector 2 via the coupling output terminal 50 are sufficiently suppressed.

As illustrated in FIG. 5, the lower corner frequency fc1 (=fb1=fe1) of the two filters is lower than the fundamental frequency f0. Also, the higher corner frequency fc2 (=fb2=fe2) of the two filters is higher than the fundamental frequency f0. That is, the fundamental frequency f0 is included in the pass band (greater than or equal to fb1 and less than or equal to fb2) of the band-pass filter 30B. Also, the frequencies f1 and f2 of unnecessary signals are included in the pass bands (less than or equal to fe1, greater than or equal to fe2) of the band-elimination filter 40E.

With this configuration, the desired signal with the fundamental frequency f0 among radio frequency signals inputted from the node N1 passes through the band-pass filter 30B and enters the detector 2 via the node N3 and the coupling output terminal 50. Because unnecessary signals other than the fundamental wave do not substantially pass through the band-pass filter 30B, the detection accuracy of the detector 2 can be improved.

Each of the low-pass filter 30L, the high-pass filter 40H, the band-pass filter 30B, and the band-elimination filter 40E is an LC filter, which includes at least one of a capacitor and an inductor. Alternatively, at least one of the low-pass filter 30L, the high-pass filter 40H, the band-pass filter 30B, and the band-elimination filter 40E may include an acoustic wave filter, such as a surface acoustic wave (SAW) filter or a bulk acoustic wave (BAW) filter. Also, at least one of the low-pass filter 30L, the high-pass filter 40H, the band-pass filter 30B, and the band-elimination filter 40E may be a filter formed in an integrated passive device (IPD).

[1-3. Flow of Signals in Directional Coupler]

Next, the flow of signals in the directional coupler 1 according to the present embodiment is described. Below, advantageous effects of the directional coupler 1 according to the present embodiment are also described through a comparison with a directional coupler 1x according to a comparative example illustrated in FIG. 6.

Figure 6:
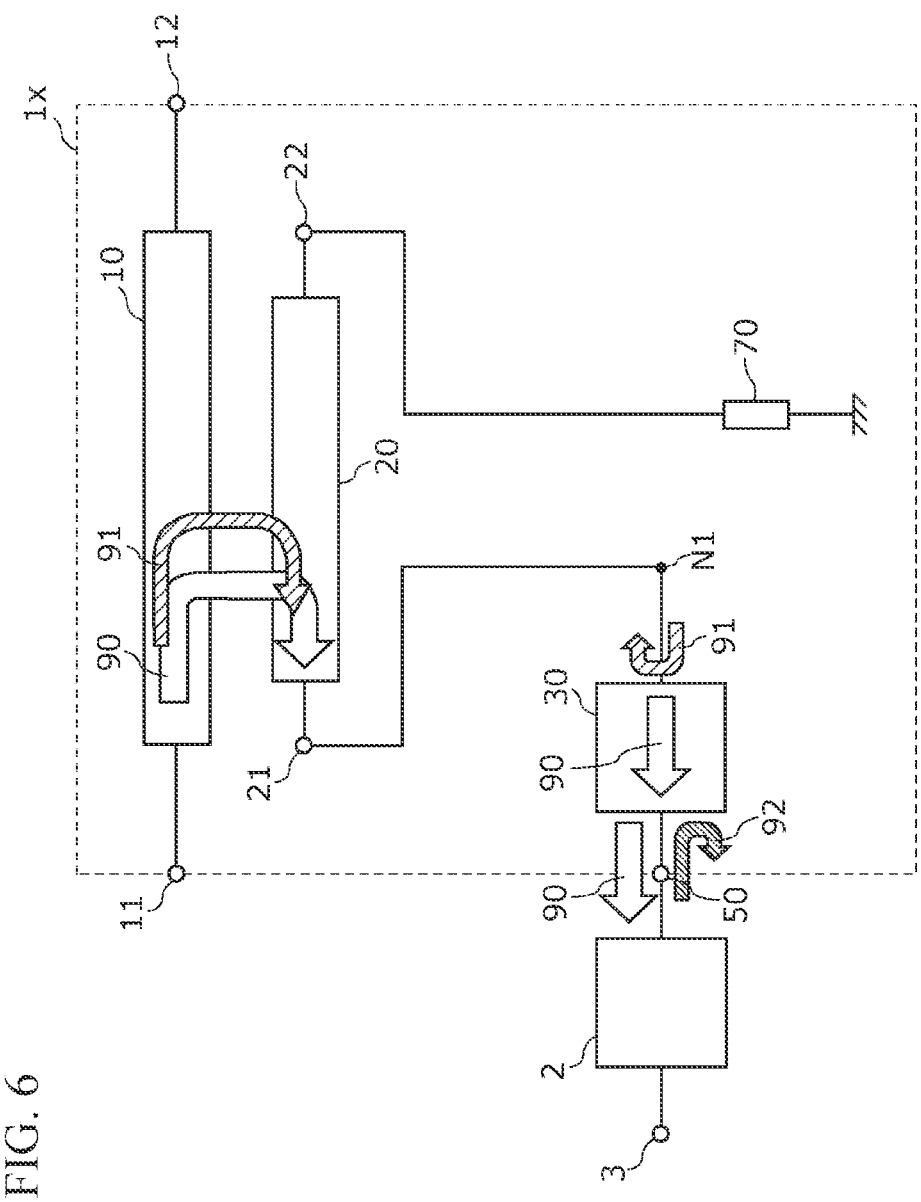
FIG. 6 is a drawing illustrating the signals flowing in a directional coupler according to a comparative example.
Figure 7:
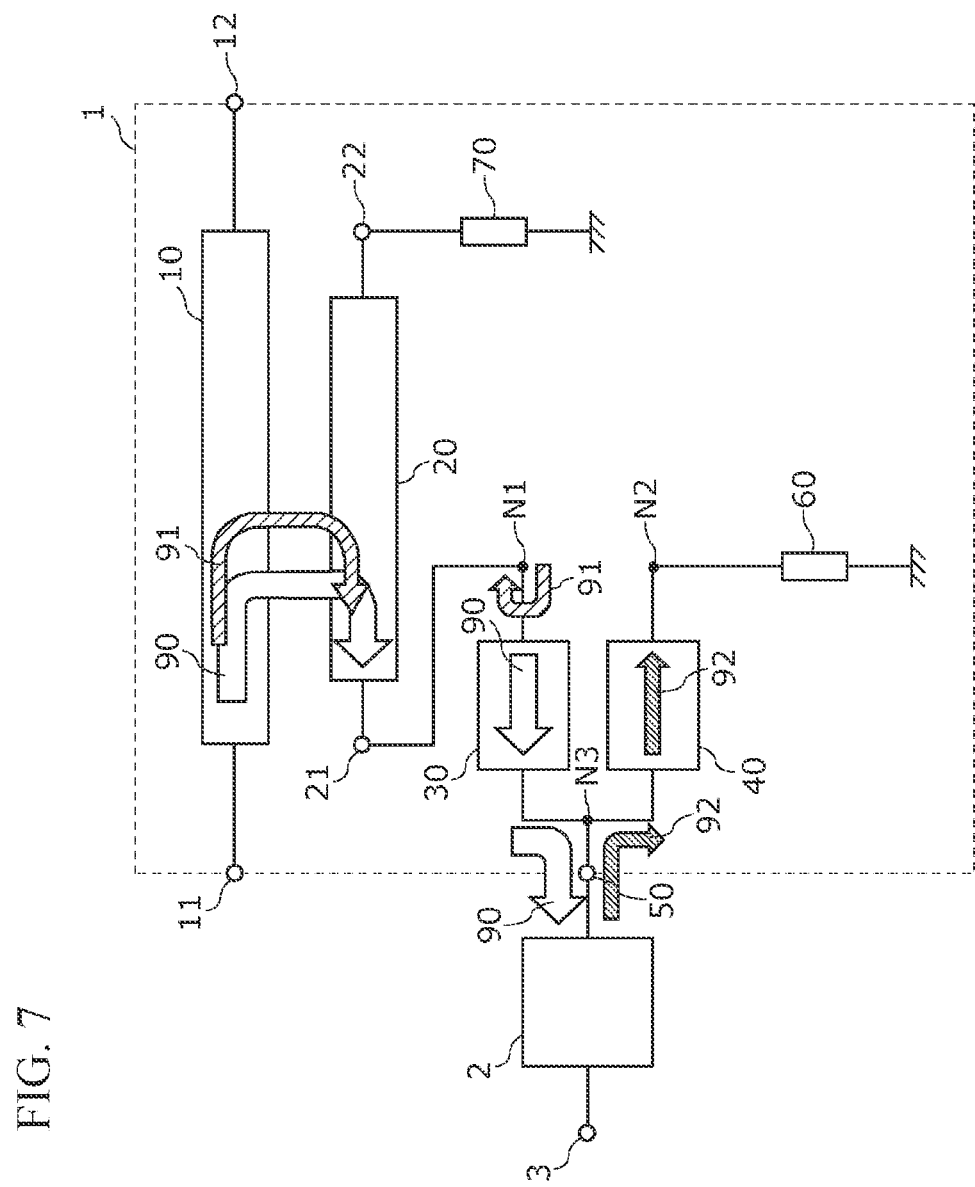
FIG. 7 is a drawing illustrating the signals flowing in the directional coupler according to the first embodiment.

FIG. 6 is a drawing illustrating the signals flowing in the directional coupler 1x according to a comparative example. FIG. 7 is a drawing illustrating the signals flowing in the directional coupler 1 according to the present embodiment. As illustrated in FIG. 6, the directional coupler 1x of the comparative example differs from the directional coupler 1 of the present embodiment in that the directional coupler 1x does not include the filter 40 and the termination circuit 60.

In the descriptions below, it is assumed that radio frequency signals are transmitted through the main line 10 from the input-output terminal 11 toward the input-output terminal 12. As illustrated in FIGS. 6 and 7, some of the radio frequency signals transmitted through the main line 10 flow through the sub line 20 as the coupled signals due to the electromagnetic coupling between the main line 10 and the sub line 20. The coupled signals include a fundamental signal 90 with the fundamental frequency f0 of the radio frequency signal and a spurious signal 91 other than the fundamental signal 90. The spurious signal 91 is, for example, a distorted signal generated in a transmitter circuit.

In the directional coupler 1x illustrated in FIG. 6, both of the fundamental signal 90 and the spurious signal 91 are inputted from the end 21 of the sub line 20 to the filter 30 via the node N1. Because the filter 30 transmits the fundamental signal 90, the fundamental signal 90 passed through the filter 30 is inputted to the detector 2. As a result, the detector 2 detects the fundamental signal 90.

In contrast, the spurious signal 91 cannot pass through the filter 30 and is reflected by the filter 30. If the filter 30 is not provided and the spurious signal 91 is inputted to the detector 2, the spurious signal 91 causes an error in the detected signal power and thereby reduces the detection accuracy. In contrast, with the directional couplers 1x and 1, because the spurious signal 91 is blocked by the filter 30 and is not inputted to the detector 2, the detection accuracy of the detector 2 can be improved.

However, the distorted signal 92 is generated in the detector 2. The distorted signal 92 corresponds to a harmonic wave of the fundamental signal 90. That is, the main frequency of the distorted signal 92 is two times or three times greater than the fundamental frequency. The distorted signal 92 generated in the detector 2 returns to the filter 30 via the coupling output terminal 50. Because the distorted signal 92 is not included in the pass band of the filter 30, the distorted signal 92 is reflected by the filter 30 and returns to the detector 2 via the coupling output terminal 50. The distorted signal 92 returning to the detector 2 reduces the detection accuracy of the detector 2.

Thus, due to the influence of the distorted signal 92, the directional coupler 1x of the comparative example cannot improve the accuracy of the detector 2.

In contrast, in the directional coupler 1 according to the present embodiment, as illustrated in FIG. 7, the filter 40 is connected to the coupling output terminal 50. The filter 40 is configured to transmit the distorted signal 92 and to not transmit the fundamental signal 90. Accordingly, the distorted signal 92 inputted from the coupling output terminal 50 to the node N3 passes through the filter 40.

The node N2, which is the other end of the filter 40, is terminated by the termination circuit 60. Specifically, because the impedance of the termination circuit 60 is adjusted to be able to properly absorb and consume the distorted signal 92, the distorted signal 92 passed through the filter 40 is absorbed and consumed by the termination circuit 60.

As described above, the directional coupler 1 according to the present embodiment can prevent the distorted signal 92 from returning to the detector 2. Accordingly, the directional coupler 1 can improve the detection accuracy of the detector 2.

[1-4. Effects, etc.]

As described above, the directional coupler 1 according to the present embodiment includes the main line 10, the sub line 20 electromagnetically coupled to the main line 10, the coupling output terminal 50 connected to the end 21 of the sub line 20, the filter 30 connected between the end 21 of the sub line 20 and the coupling output terminal 50, and the filter 40 having a pass band higher than the pass band of the filter 30. One end of the filter 40 is connected to the coupling output terminal 50, and another end of the filter 40 is terminated.

With this configuration, when the detector 2 is connected to the coupling output terminal 50, the fundamental signal 90 with the target frequency can be inputted to the detector 2, and the spurious signal 91 can be prevented by the filter 30 from being inputted to the detector 2. Also, because the distorted signal 92 generated in the detector 2 passes through the filter 40 and is then absorbed and consumed, the distorted signal 92 is prevented from returning to the detector 2. Thus, because the spurious signal 91 and the distorted signal 92 are less likely to be inputted to the detector 2, the detection accuracy can be improved.

Also, the distorted signal 92 does not pass through the filter 30 and therefore can be prevented from entering the main line 10 via the sub line 20. If the distorted signal 92 enters the main line 10, the distorted signal 92 may cause failures, such as the unnecessary radiation from an antenna and the generation of the intermodulation distortion, in the transmitter operations. The directional coupler 1 of the present embodiment prevents the distorted signal 92 from entering the main line 10 and thereby makes it possible to prevent the occurrence of the failures in the transmitter operations.

Second Embodiment

Next, a second embodiment is described.

A directional coupler according to the second embodiment mainly differs from the directional coupler of the first embodiment in that a circuit including a switch, which may cause the generation of a distorted signal, and multiple filters are connected to the other end of the sub line. Below, the differences from the first embodiment are mainly described, and the descriptions of common features are omitted or simplified.

[2-1. Configuration]

Figure 8:
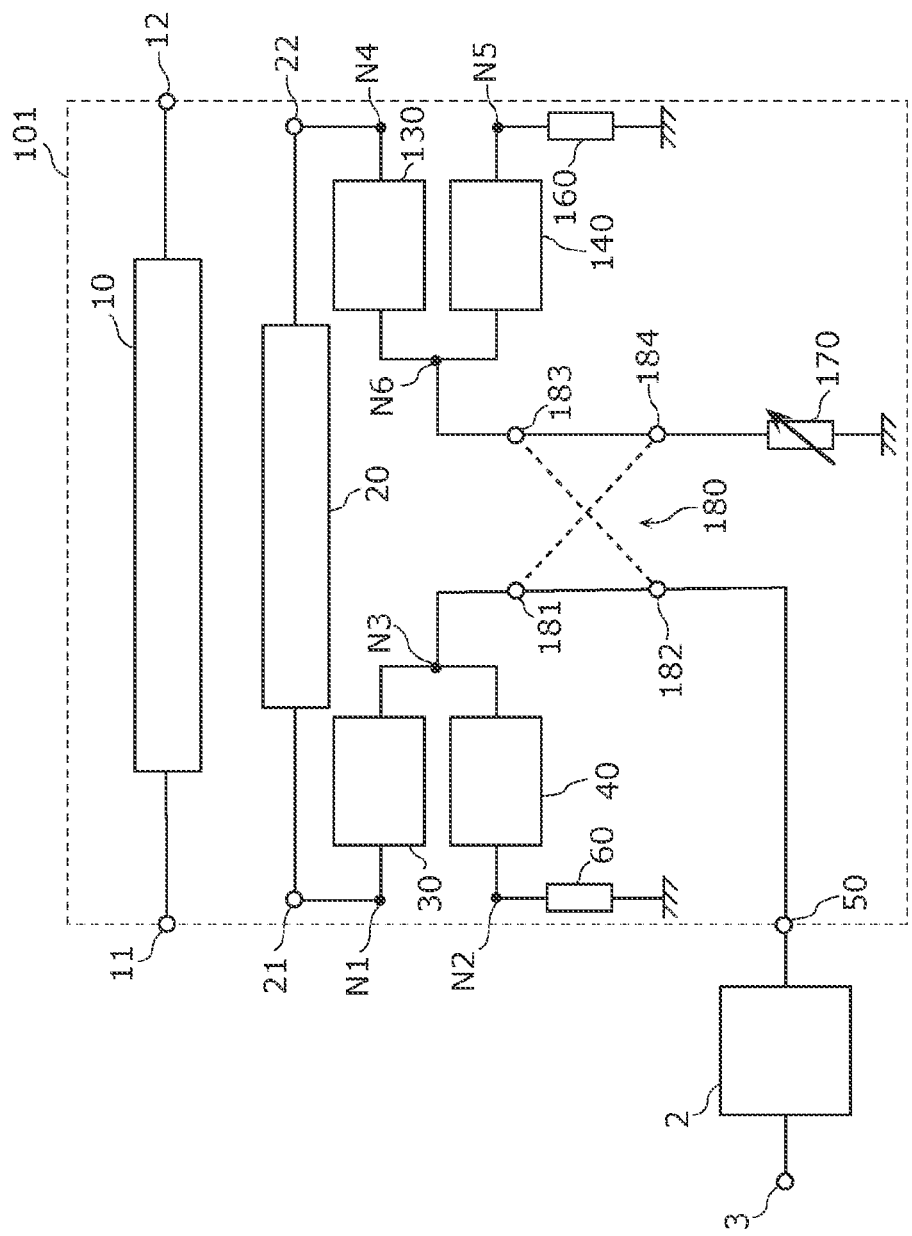
FIG. 8 is a drawing illustrating a configuration of a directional coupler according to a second embodiment.

First, a configuration of a directional coupler according to the second embodiment is described with reference to FIG. 8. FIG. 8 is a drawing illustrating a configuration of a directional coupler 101 according to the present embodiment.

As illustrated in FIG. 8, the directional coupler 101 differs from the directional coupler 1 of the first embodiment in that a variable termination circuit 170 is provided in place of the termination circuit 70. Also, the directional coupler 101 includes a filter 130, a filter 140, a termination circuit 160, and a switch circuit 180.

The filter 130 is an example of a third filter and is connected between the end 22 of the sub line 20 and the variable termination circuit 170. A node N4, which is one end of the filter 130, is connected to the end 22 of the sub line 20. A node N6, which is another end of the filter 130, is connected to the variable termination circuit 170. In the present embodiment, the node N6 is connected to the variable termination circuit 170 via the switch circuit 180.

The filter 130 has a predetermined pass band and is configured to transmit a desired signal. Specifically, the filter 130 transmits a signal with the target frequency to be detected by the detector 2.

As a non-limiting example, the filter 130 has the same pass band as the filter 30. As another example, when the filter 30 is the low-pass filter 30L, the filter 130 may be the band-pass filter 30B. Alternatively, when the filter 30 is the band-pass filter 30B, the filter 130 may be the low-pass filter 30L. Furthermore, modifications applicable to the filter 30 are also applicable to the filter 130.

The filter 140 is an example of a fourth filter and is connected between the variable termination circuit 170 and the ground. The node N6, which is one end of the filter 140, is connected to the variable termination circuit 170. A node N5, which is another end of the filter 140, is terminated. Specifically, the node N5 of the filter 140 is connected to the ground via the termination circuit 160.

The filter 140 has a pass band that is higher than the pass band of the filter 130. Specifically, the filter 140 transmits a signal in a harmonic band of the target frequency to be detected by the detector 2. The filter 140 may have any pass band including a pass band higher than the pass band of the filter 130. The filter 140 may be a band-pass filter or a high-pass filter having a pass band higher than the pass band of the filter 130, or may be a band-elimination filter that blocks only the pass band of the filter 130.

As a non-limiting example, the filter 140 has the same pass band as the filter 40. As another example, when the filter 40 is the high-pass filter 40H, the filter 140 may be the band-elimination filter 40E. Alternatively, when the filter 40 is the band-elimination filter 40E, the filter 140 may be the high-pass filter 40H. Furthermore, modifications applicable to the filter 40 are also applicable to the filter 140.

The termination circuit 160 is connected to the node N5 of the filter 140. The impedance of the termination circuit 160 is adjusted to a predetermined value so that a signal passed through the filter 140 can be absorbed and consumed. Specifically, the impedance of the termination circuit 160 is adjusted to an appropriate value to absorb and consume distorted signals 94 and 95 (see FIG. 10) generated in the switch circuit 180 and the variable termination circuit 170.

The variable termination circuit 170 is an example of a termination circuit connected to the end 22 of the sub line 20. The variable termination circuit 170 is a termination circuit the impedance of which is variable.

Figure 9:
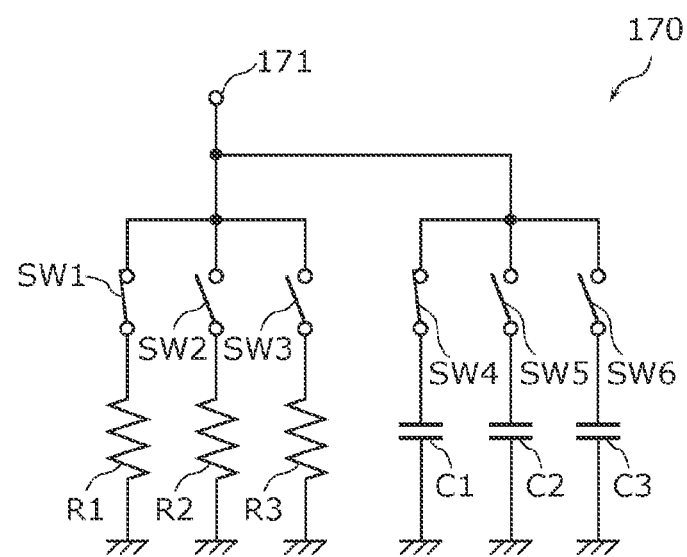
FIG. 9 is a circuit diagram of an example of a variable termination circuit provided in the directional coupler according to the second embodiment.

FIG. 9 is a circuit diagram illustrating an example of the variable termination circuit 170 provided in the directional coupler 101 according to the present embodiment. As illustrated in FIG. 9, the variable termination circuit 170 includes three resistors R1 to R3, three capacitors C1 to C3, six switches SW1 to SW6, and a terminal 171.

The terminal 171 is connected to the end 22 of the sub line 20. In the present embodiment, the terminal 171 is connected to the end 22 of the sub line 20 via the filter 130 and the switch circuit 180.

Each of the resistors R1 to R3 and the capacitors C1 to C3 is connected in series with one of the six switches SW1 to SW6. Series circuits each including a resistor and a switch and series circuits each including a capacitor and a switch are connected parallel to each other between the terminal 171 and the ground.

The resistance values of the resistors R1 to R3 may be the same or may be different from each other. The capacitance values of the capacitors C1 to C3 may be the same or may be different from each other. Also, the switch connected to one of the three resistors R1 to R3 may be omitted. Furthermore, the switch connected to one of the three capacitors C1 to C3 may be omitted.

Each of the switches SW1 to SW6 is a switching element, such as a metal-oxide-semiconductor field-effect transistor (MOSFET). Each of the switches SW1 to SW6 can be switched between on and off (conductive state/non-conductive state). This makes it possible to change the impedance of the variable termination circuit 170. For example, the switches SW1 to SW6 are controlled in accordance with the fundamental frequency f0 of a radio frequency signal transmitted through the main line 10. Specifically, the switches SW1 to SW6 are turned on and off to set the impedance of the variable termination circuit 170 at such a value that a signal with the fundamental frequency f0 can be sufficiently absorbed and consumed by the variable termination circuit 170.

The variable termination circuit 170 may include one or more inductors. Also, the circuit configuration of the variable termination circuit 170 is not limited to any specific configuration. The variable termination circuit 170 may be configured to not include resistors or capacitors.

The switch circuit 180 includes an example of a first switch circuit connected between the filter 30 and the coupling output terminal 50. Also, the switch circuit 180 includes an example of a second switch circuit connected between the filter 130 and the variable termination circuit 170.

As illustrated in FIG. 8, the switch circuit 180 includes four terminals 181 to 184. The terminal 181 is connected to the node N3. The terminal 182 is connected to the coupling output terminal 50. The terminal 183 is connected to the node N6. The terminal 184 is connected to the variable termination circuit 170.

In the present embodiment, the node N3, which is an end of each of the filters 30 and 40, is connected to one of the coupling output terminal 50 and the variable termination circuit 170 via the switch circuit 180. Also, the node N6, which is an end of each of the filters 130 and 140, is connected to another one of the coupling output terminal 50 and the variable termination circuit 170 via the switch circuit 180.

Specifically, the switch circuit 180 is configured to switch between a first connection state in which the end 21 of the sub line 20 is connected to the coupling output terminal 50 via the filter 30, and the end 22 of the sub line 20 is connected to the variable termination circuit 170 via the filter 130; and a second connection state in which the end 22 of the sub line 20 is connected to the coupling output terminal 50 via the filter 130, and the end 21 of the sub line 20 is connected to the variable termination circuit 170 via the filter 30. In the first connection state, the terminal 181 and the terminal 182 are connected to (in electrical connection with) each other and the terminal 183 and the terminal 184 are connected to (in electrical connection with) each other as indicated by the solid lines in FIG. 8. In the second connection state, the terminal 181 and the terminal 184 are connected to (in electrical connection with) each other and the terminal 183 and the terminal 182 are connected to (in electrical connection with) each other as indicated by the dashed lines in FIG. 8. The electrical connection and the electrical disconnection between the terminals of the switch circuit 180 can be switched by using switching elements such as MOSFETs.

By changing the connection states using the switch circuit 180, it is possible to switch the end of the sub line 20 connected to the coupling output terminal 50 between the end 21 and the end 22. This enables the detector 2 to perform the bidirectional detection. That is, the detector 2 can detect not only the fundamental signal 90 of a traveling wave but also the fundamental signal of a reflected wave.

[2-2. Flow of Signals in Directional Coupler]

Figure 10:
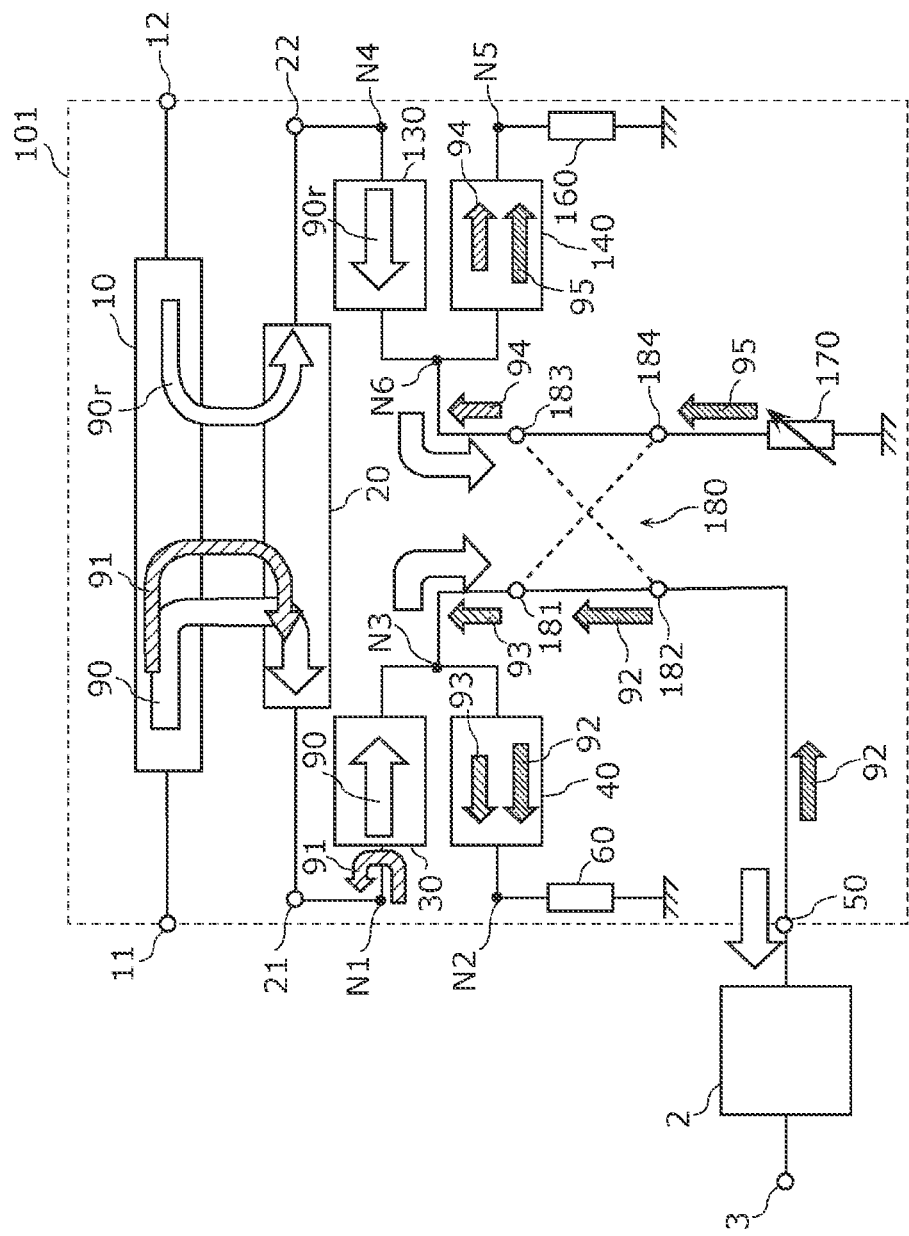
FIG. 10 is a drawing illustrating the signals flowing in the directional coupler according to the second embodiment.

Next, the flow of signals in the directional coupler 101 according to the present embodiment is described with reference to FIG. 10. FIG. 10 is a drawing illustrating the signals flowing in the directional coupler 101 according to the present embodiment.

The flow of the fundamental signal 90, the spurious signal 91, and the distorted signal 92 is the same as that in the first embodiment. Accordingly, as with the first embodiment, the directional coupler 101 of the present embodiment can improve the detection accuracy.

In the main line 10, a traveling wave is transmitted from the input-output terminal 11 toward the input-output terminal 12, and also a reflected wave is transmitted from the input-output terminal 12 toward the input-output terminal 11. As illustrated in FIG. 10, as with the traveling wave, the reflected wave is taken out to the sub line 20 as the reflected coupled signal due to the electromagnetic coupling between the main line 10 and the sub line 20. The reflected coupled signal includes a reflected fundamental signal 90r with the fundamental frequency f0.

The reflected fundamental signal 90r is inputted to the filter 130 from the end 22 of the sub line 20 via the node N4. Because the filter 130 transmits the reflected fundamental signal 90r, the reflected fundamental signal 90r reaches the variable termination circuit 170 via the node N6 and the switch circuit 180. Because the impedance of the variable termination circuit 170 is adjusted to be able to absorb and consume the reflected fundamental signal 90r, the reflected fundamental signal 90r is absorbed and consumed by the variable termination circuit 170. This configuration prevents the reflected fundamental signal 90r from returning to the sub line 20 and reaching the coupling output terminal 50 and thereby makes it possible to prevent the reduction in the detection accuracy of the detector 2. This configuration also prevents the reflected fundamental signal 90r from returning to the main line 10 via the sub line 20 and thereby makes it possible to prevent the occurrence of failures in the transmitter operations.

As described above, each of the variable termination circuit 170 and the switch circuit 180 includes switching elements for switching between the conduction and the non-conduction of wires. When a switching element is turned on and off, a certain distorted signal is generated. For example, as illustrated in FIG. 10, the switch circuit 180 generates distorted signals 93 and 94, and the variable termination circuit 170 generates a distorted signal 95. Each of the distorted signals 93 to 95 has, for example, a frequency higher than the fundamental frequency f0.

The distorted signal 93 is generated in the switch circuit 180 and flows toward the node N3. The distorted signal 93 has a frequency different from the fundamental frequency f0 and therefore does not pass through the filter 30. Accordingly, the distorted signal 93 is prevented from entering the main line 10 via the sub line 20, and the occurrence of failures in the transmitter operations can be prevented.

Also, because the pass band of the filter 30 and the pass band of the filter 40 are in a complementary relationship, the distorted signal 93, which does not pass through the filter 30, passes through the filter 40 and is absorbed and consumed by the termination circuit 60. That is, because the distorted signal 93 is not reflected by the filters 30 and 40, the distorted signal 93 is prevented from being inputted to the detector 2 via the switch circuit 180 and the coupling output terminal 50. Accordingly, the reduction in detection accuracy can be prevented.

The distorted signal 94 is generated in the switch circuit 180 and flows toward the node N6. The distorted signal 94 has a frequency different from the fundamental frequency f0 and therefore does not pass through the filter 130. Accordingly, the distorted signal 94 is prevented from entering the main line 10 via the sub line 20, and the occurrence of failures in the transmitter operations can be prevented.

Also, because the pass band of the filter 130 and the pass band of the filter 140 are in a complementary relationship, the distorted signal 94, which does not pass through the filter 130, passes through the filter 140 and is absorbed and consumed by the termination circuit 160. That is, the distorted signal 94 is not reflected by the filters 130 and 140 and does not influence other circuits.

The distorted signal 95 is generated in the variable termination circuit 170 and flows toward the node N6 via the switch circuit 180. As with the distorted signal 94, the distorted signal 95 does not pass through the filter 130, but passes through the filter 140 and is absorbed and consumed by the termination circuit 160. Accordingly, the occurrence of failures in the transmitter operations can be prevented.

Here, depending on the connection state of the switch circuit 180, the distorted signal 95 flows toward the node N3. In this case, as with the distorted signal 93, the distorted signal 95 does not pass through the filter 30, but passes through the filter 40 and is absorbed and consumed. Accordingly, also in this case, the occurrence of failures in the transmitter operations can be prevented.

[2-3. Effects, etc.]

As described above, the directional coupler 101 according to the present embodiment includes a termination circuit connected to the end 22 of the sub line 20, the filter 130 connected between the end 22 of the sub line 20 and the termination circuit, and the filter 140 with a pass band higher than the pass band of the filter 130. One end of the filter 140 is connected to the termination circuit, and another end of the filter 140 is terminated.

With this configuration, a distorted signal generated in a component connected to the end 22 of the sub line 20 does not pass through the filter 130 and is therefore prevented from entering the main line 10 via the sub line 20. Accordingly, the occurrence of failures in the transmitter operations can be prevented.

For example, the termination circuit connected to the end 22 is the variable termination circuit 170 the impedance of which is variable.

The distorted signal 95 generated in the variable termination circuit 170 does not pass through the filter 130, but passes through the filter 140 and is absorbed and consumed. Because the distorted signal 95 is prevented from entering the main line 10 via the sub line 20, the occurrence of failures in the transmitter operations can be prevented.

For example, the directional coupler 101 further includes a first switch circuit connected between the filter 30 and the coupling output terminal 50. One end of the filter 40 is connected to the coupling output terminal 50 via the first switch circuit.

With this configuration, the distorted signal 93 generated in the switch circuit 180 does not pass through the filter 30, but passes through the filter 40 and is absorbed and consumed. Because the distorted signal 93 is prevented from entering the main line 10 via the sub line 20, the occurrence of failures in the transmitter operations can be prevented. Also, the distorted signal 93 is not reflected by the filters 30 and 40 and is therefore prevented from being inputted to the detector 2. Accordingly, the reduction in the detection accuracy of the detector 2 can be prevented.

For example, the directional coupler 101 further includes a second switch circuit connected between the filter 130 and the termination circuit. One end of the filter 140 is connected to the termination circuit via the second switch circuit.

With this configuration, the distorted signal 94 generated in the switch circuit 180 does not pass through the filter 130, but passes through the filter 140 and is absorbed and consumed. Because the distorted signal 94 is prevented from entering the main line 10 via the sub line 20, the occurrence of the failures in transmitter operations can be prevented.

In the present embodiment, the switch circuit 180 of the directional coupler 101 may be omitted. Also, the directional coupler 101 may include the termination circuit 70 with a fixed impedance instead of the variable termination circuit 170.

Third Embodiment

Next, a third embodiment is described.

The third embodiment differs from the second embodiment in that a directional coupler of the third embodiment includes, at each end of the sub line, a filter having one end terminated. Below, the differences from the second embodiment are mainly described, and the descriptions of common features are omitted or simplified.

[3-1. Configuration]

Figure 11:
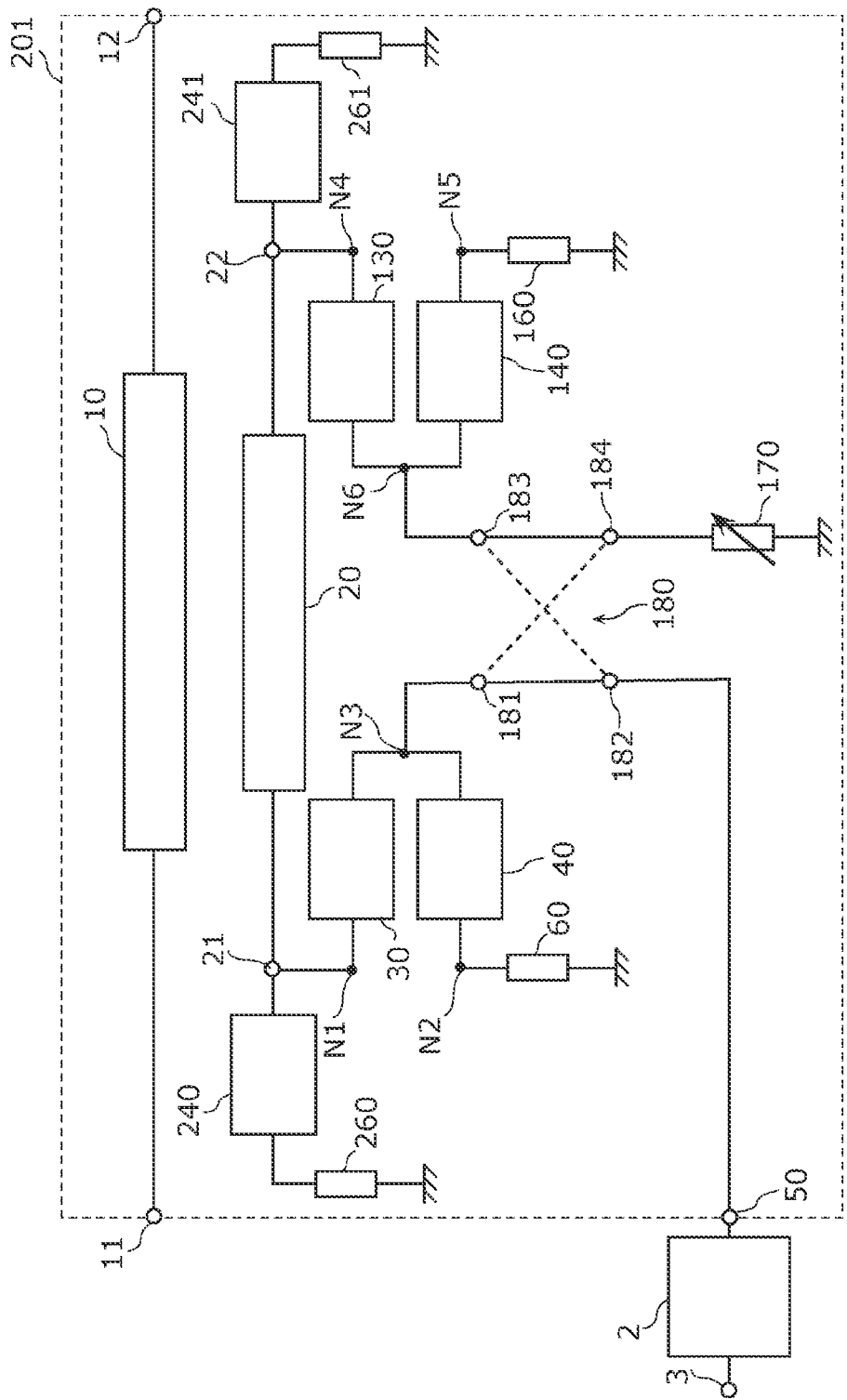
FIG. 11 is a drawing illustrating a configuration of a directional coupler according to a third embodiment.

First, a configuration of a directional coupler according to the third embodiment is described with reference to FIG. 11. FIG. 11 is a drawing illustrating a configuration of a directional coupler 201 according to the present embodiment.

As illustrated in FIG. 11, compared with the directional coupler 101 of the second embodiment, the directional coupler 201 additionally includes filters 240 and 241 and termination circuits 260 and 261.

The filter 240 is an example of a sixth filter and is connected between the end 21 of the sub line 20 and the ground. One end of the filter 240 is connected to a path connecting the end 21 of the sub line 20 to the filter 30. Another end of the filter 240 is terminated. Specifically, the other end of the filter 240 is connected to the ground via the termination circuit 260.

The filter 240 has a pass band different from the pass band of the filter 30. Specifically, the filter 240 transmits a signal in a harmonic band of the target frequency to be detected by the detector 2.

The pass band of the filter 240 and the pass band of the filter 30 are in a complementary relationship. As a non-limiting example, the filter 240 has the same pass band as the filter 40. As another example, when the filter 40 is the high-pass filter 40H, the filter 240 may be the band-elimination filter 40E. Alternatively, when the filter 40 is the band-elimination filter 40E, the filter 240 may be the high-pass filter 40H.

The filter 241 is an example of a fifth filter and is connected between the end 22 of the sub line 20 and the ground. One end of the filter 241 is connected to a path connecting the end 22 of the sub line 20 to the filter 130. Another end of the filter 241 is terminated. Specifically, the other end of the filter 241 is connected to the ground via the termination circuit 261.

The filter 241 has a pass band different from the pass band of the filter 130. Specifically, the filter 241 transmits a signal in a harmonic band of the target frequency to be detected by the detector 2.

The pass band of the filter 241 and the pass band of the filter 130 are in a complementary relationship. As a non-limiting example, the filter 241 has the same pass band as the filter 140. As another example, when the filter 140 is the high-pass filter 40H, the filter 241 may be the band-elimination filter 40E. Alternatively, when the filter 140 is the band-elimination filter 40E, the filter 241 may be the high-pass filter 40H.

The termination circuit 260 is connected to the other end of the filter 240. The impedance of the termination circuit 260 is adjusted to a predetermined value so that a signal passed through the filter 240 can be absorbed and consumed. Specifically, the impedance of the termination circuit 260 is adjusted to an appropriate value to absorb and consume the spurious signal 91 (see FIG. 12) flowing in the sub line 20 as a result of the electromagnetic coupling with the main line 10.

The termination circuit 261 is connected to another end of the filter 241. The impedance of the termination circuit 261 is adjusted to a predetermined value to be able to absorb and consume a signal passed through the filter 241. Specifically, the impedance of the termination circuit 261 is adjusted to an appropriate value to absorb and consume a reflected spurious signal 91*r* (see FIG. 12) flowing in the sub line 20 as a result of the electromagnetic coupling with the main line 10.

[3-2. Flow of Signals in Directional Coupler]

Figure 12:
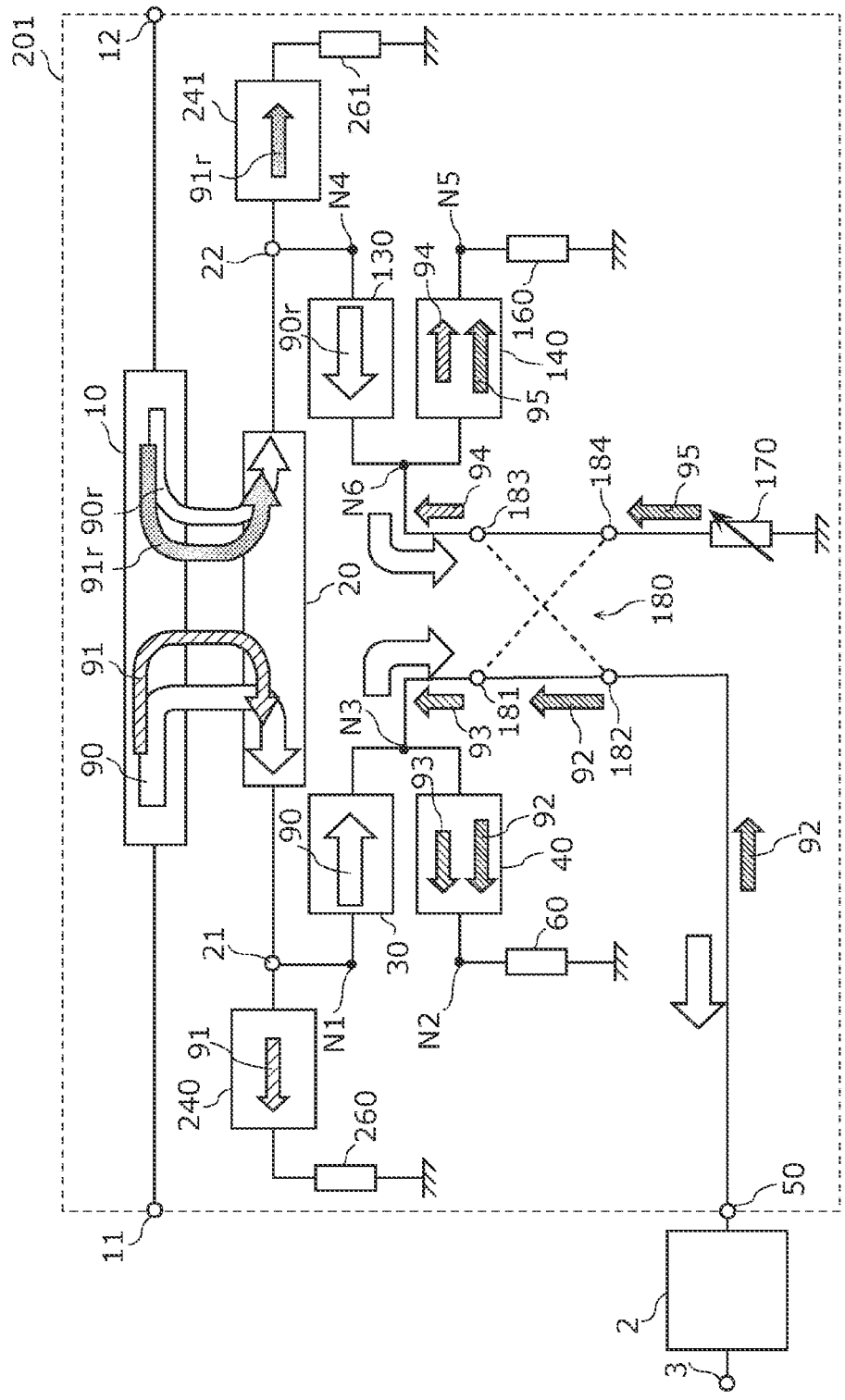
FIG. 12 is a drawing illustrating the signals flowing in the directional coupler according to the third embodiment.

Next, the flow of signals in the directional coupler 201 of the present embodiment is described with reference to FIG. 12. FIG. 12 is a drawing illustrating the signals flowing in the directional coupler 201 according to the present embodiment.

The flow of the fundamental signal 90, the reflected fundamental signal 90*r*, and the distorted signals 92 to 95 is the same as that in the second embodiment. Accordingly, as with the second embodiment, the directional coupler 201 of the present embodiment can improve the detection accuracy and can prevent the occurrence of failures in the transmitter operations.

In the present embodiment, the filter 240, which transmits a signal with a frequency different from the fundamental frequency f0, is connected to the end 21 of the sub line 20. Accordingly, the spurious signal 91 passes through the filter 240 and is absorbed and consumed by the termination circuit 260.

Also, the filter 241, which transmits a signal with a frequency different from the fundamental frequency f0, is connected to the end 22 of the sub line 20. Accordingly, the reflected spurious signal 91r passes through the filter 241 and is absorbed and consumed by the termination circuit 261.

With the above configuration, both of the spurious signal 91 and the reflected spurious signal 91r are made less likely to return to the sub line 20 and are prevented from entering the main line 10 via the sub line 20. Accordingly, the occurrence of failures in the transmitter operations can be prevented.

[3-3. Effects, etc.]

As described above, the directional coupler 201 of the present embodiment includes the filter 241 with a pass band different from the pass band of the filter 130. One end of the filter 241 is connected to a path connecting the end 22 of the sub line 20 to the filter 130, and the other end of the filter 241 is terminated.

This configuration makes it possible to prevent the reflected spurious signal 91r flowing in the sub line 20 from entering the main line 10 and thereby prevent the occurrence of failures in the transmitter operations.

Also, for example, the directional coupler 201 further includes the filter 240 with a pass band different from the pass band of the filter 30. One end of the filter 240 is connected to a path connecting the end 21 of the sub line 20 to the filter 30, and the other end of the filter 240 is terminated.

This configuration makes it possible to prevent the spurious signal 91 flowing in the sub line 20 from entering the main line 10 and thereby prevent the occurrence of failures in the transmitter operations.

In the present embodiment, the directional coupler 201 may include only one of the filters 240 and 241.

Variation

Next, a variation of the filter configuration in the directional coupler 1, 101, or 201 of the above embodiment is described. Below, a variation of the configuration of the filters 30 and 40 connected to the coupling output terminal 50 is described with reference to FIG. 13.

Figure 13:
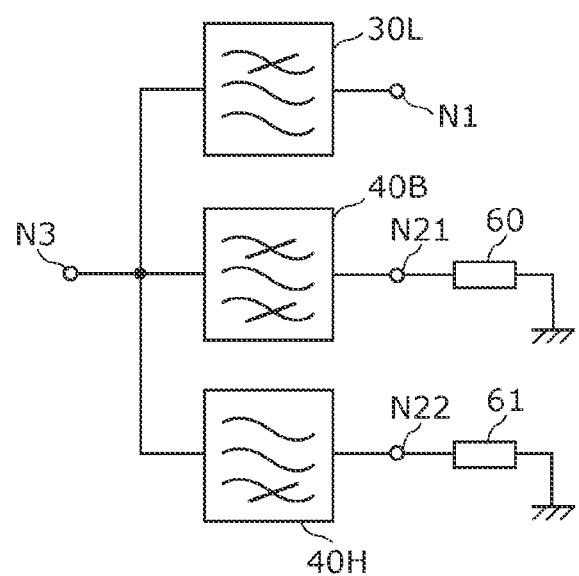
FIG. 13 is a drawing illustrating the variations of the configurations of the multiple filters provided in the directional coupler of each embodiment.

FIG. 13 is a drawing illustrating a variation of the configuration of multiple filters provided in the directional coupler 1, 101, or 201. FIG. 13 illustrates an example in which each of the low-pass filter 30L, a band-pass filter 40B, and the high-pass filter 40H is connected to the node N3 (i.e., coupling output terminal 50).

Each of the band-pass filter 40B and the high-pass filter 40H is an example of a second filter. A node N21, which is an end of the band-pass filter 40B, is terminated. Specifically, the node N21 of the band-pass filter 40B is connected to the ground via the termination circuit 60. Also, a node N22, which is an end of the high-pass filter 40H, is terminated. Specifically, the node N22 of the high-pass filter 40H is connected to the ground via a termination circuit 61.

The low-pass filter 30L, the band-pass filter 40B, and the high-pass filter 40H constitute, for example, a triplexer. For example, the pass band of the low-pass filter 30L, the pass band of the band-pass filter 40B, and the pass band of the high-pass filter 40H are in a complementary relationship. That is, these three filters are configured such that in the entire frequency band, a signal flowing from the node N3 toward the filters passes through one of the three filters and does not pass through the other two filters.

The impedance of the termination circuit 60 and the impedance of the termination circuit 61 are different from each other. For example, the impedance of the termination circuit 60 is adjusted to properly absorb and consume a signal with the frequency 2f0 of the second harmonic wave of the fundamental frequency f0. Also, the impedance of the termination circuit 61 is adjusted to properly absorb and consume a signal with the frequency 3f0 of the third harmonic wave of the fundamental frequency f0 or a higher frequency. Also, the impedance of the termination circuit 60 may be adjusted to be able to properly absorb and consume the distorted signal 92 generated in the detector 2, and the impedance of the termination circuit 61 may be adjusted to be able to properly absorb and consume the distorted signal 93 generated in the switch circuit 180. This configuration makes it possible to properly absorb and consume each of the distorted signals 92 and 93 even when the distorted signals 92 and 93 have different frequencies.

As described above, the directional coupler 1, 101, or 201 may include multiple filters 40.

This configuration makes it possible to absorb and consume signals with different frequencies by causing the signals to pass through different filters. This in turn makes it possible to prevent the distorted signals generated in the components connected to the end 21 of the sub line 20 from returning to the detector 2 or the main line 10 and thereby makes it possible to improve the detection accuracy and prevent the occurrence of failures in the transmitter operations.

The filter configuration illustrated in FIG. 13 may also be applied to the configuration of the filters 130 and 140 connected to the variable termination circuit 170 or the switch circuit 180. That is, the directional coupler 1, 101, or 201 may include multiple filters 140.

Specifically, the nodes N1 and N3 illustrated in FIG. 13 correspond to the nodes N4 and N6, respectively. The low-pass filter 30L becomes an example of the filter 130, and each of the band-pass filter 40B and the high-pass filter 40H becomes an example of the filter 140.

This configuration makes it possible to prevent the distorted signals generated in the components connected to the end 22 of the sub line 20 from returning to the main line 10 and thereby makes it possible to prevent the occurrence of failures in the transmitter operations.

The combination of three filters is not limited to the example illustrated in FIG. 13. For example, the three filters may be selected from a low-pass filter, a high-pass filter, a band-pass filter, and a band-elimination filter. The three filters may include filters of the same type. Also, three or more terminated filters (second filters or fourth filters) may be provided.

Others

Directional couplers according to the present disclosure are described above based on the embodiments. However, the present disclosure is not limited to the above-described embodiments.

For example, the termination circuit 60 of the directional coupler 1, 101, or 201 may be omitted. Even when the termination circuit 60 is omitted, by sufficiently lowering the output impedance, the filter 40 may function as with a case in which the other end of the filter 40 is terminated. Similarly, the termination circuit 160, 260, or 261 of the directional coupler 101 or 201 may be omitted. Furthermore, the termination circuit 61 illustrated in FIG. 13 may also be omitted.

Also, for example, at least one of the low-pass filter 30L, the high-pass filter 40H, the band-pass filter 30B, and the band-elimination filter 40E may be tunable. That is, at least one of the low-pass filter 30L, the high-pass filter 40H, the band-pass filter 30B, and the band-elimination filter 40E may be capable of changing its pass band. For the tuning, for example, a switch or a varactor may be used.

Also, for example, the filter 30 may consist only of inductors connected in series between the node N1 and the node N3. Further, the filter 40 may consist only of capacitors connected in series between the node N2 and the node N3. Similarly, the filter 130 may consist only of inductors connected in series between the node N4 and the node N6. Also, the filter 140 may consist only of capacitors connected in series between the node N5 and the node N6.

Also, for example, the directional coupler 1, 101, or 201 may include the detector 2.

For example, the directional coupler 1, 101, or 201 may include multiple main lines 10 or multiple sub lines 20. For example, the multiple sub lines 20 may be electromagnetically coupled to one main line 10. Alternatively, the multiple sub lines 20 may be electromagnetically coupled to the multiple main lines 10 in a one-to-one or many-to-one relationship. In this case, the directional coupler 1, 101, or 201 may include a line switch for selecting one or more of the multiple sub lines 20.

Furthermore, the present disclosure may include embodiments obtained by applying various modifications, which a person skilled in the art can think of, to the above embodiments and may also include embodiments implemented by combining the components and functions in the above embodiments without departing from the spirit of the present disclosure.

INDUSTRIAL APPLICABILITY

The present disclosure can be widely used for electronic devices and communication devices including a directional coupler.

1, 101, 201 directional coupler
2 detector
3 detection result output terminal
10 main line
11, 12 input-output terminal
20 sub line
21 end
22 end
30, 40, 130, 140, 240, 241 filter
30L low-pass filter
30B, 40B band-pass filter
40E band-elimination filter
40H high-pass filter
50 coupling output terminal
60, 61, 70, 160, 260, 261 termination circuit
90 fundamental signal
90r reflected fundamental signal
91 spurious signal
91r reflected spurious signal
92, 93, 94, 95 distorted signal
170 variable termination circuit
171, 181, 182, 183, 184 terminal
180 switch circuit
C1, C2, C3 capacitor
N1, N2, N3, N4, N5, N6, N21, N22 node
R1, R2, R3 resistor
SW1, SW2, SW3, SW4, SW5, SW6 switch

The invention claimed is:

1. A directional coupler comprising:
a main line;
a sub line electromagnetically coupled to the main line;
an output terminal connected to a first end of the sub line;
a first filter connected between the first end of the sub line and the output terminal;
a second filter having a pass band higher than a pass band of the first filter;
a termination circuit connected to a second end of the sub line;
a third filter connected between the second end of the sub line and the termination circuit; and
a fourth filter having a pass band higher than a pass band of the third filter,
wherein a first end of the second filter is connected to the output terminal, and a second end of the second filter is terminated, and
wherein a first end of the fourth filter is connected to the termination circuit, and a second end of the fourth filter is terminated.

2. The directional coupler according to claim 1, wherein the directional coupler comprises a plurality of second filters.

3. The directional coupler according to claim 1, wherein an impedance of the termination circuit is variable.

4. The directional coupler according to claim 3, further comprising:
a first switch circuit connected between the first filter and the output terminal,
wherein the first end of the second filter is connected to the output terminal via the first switch circuit.

5. The directional coupler according to claim 3, further comprising:
a second switch circuit connected between the third filter and the termination circuit,
wherein the first end of the fourth filter is connected to the termination circuit via the second switch circuit.

6. The directional coupler according to claim 3, wherein the directional coupler comprises a plurality of fourth filters.

7. The directional coupler according to claim 3, further comprising:
a fifth filter having a pass band different from the pass band of the third filter,
wherein a first end of the fifth filter is connected to a path connecting the second end of the sub line to the third filter, and a second end of the fifth filter is terminated.

8. The directional coupler according to claim 1, wherein the directional coupler comprises a plurality of second filters.

9. The directional coupler according to claim 1, further comprising:
a sixth filter having a pass band different from the pass band of the first filter,
wherein a first end of the sixth filter is connected to a path connecting the first end of the sub line to the first filter, and a second end of the sixth filter is terminated.

10. The directional coupler according to claim 1, further comprising:
a first switch circuit connected between the first filter and the output terminal,
wherein the first end of the second filter is connected to the output terminal via the first switch circuit.

11. The directional coupler according to claim 10, further comprising:
a fifth filter having a pass band different from the pass band of the third filter,
wherein a first end of the fifth filter is connected to a path connecting the second end of the sub line to the third filter, and a second end of the fifth filter is terminated.

12. The directional coupler according to claim 4, further comprising:
a second switch circuit connected between the third filter and the termination circuit,
wherein the first end of the fourth filter is connected to the termination circuit via the second switch circuit.

13. The directional coupler according to claim 10, wherein the directional coupler comprises a plurality of fourth filters.

14. The directional coupler according to claim 1, further comprising:
a second switch circuit connected between the third filter and the termination circuit,
wherein the first end of the fourth filter is connected to the termination circuit via the second switch circuit.

15. The directional coupler according to claim 14, wherein the directional coupler comprises a plurality of fourth filters.

16. The directional coupler according to claim 14, further comprising:
a fifth filter having a pass band different from the pass band of the third filter,
wherein a first end of the fifth filter is connected to a path connecting the second end of the sub line to the third filter, and a second end of the fifth filter is terminated.

17. The directional coupler according to claim 1, further comprising:
a fifth filter having a pass band different from the pass band of the third filter,
wherein a first end of the fifth filter is connected to a path connecting the second end of the sub line to the third filter, and a second end of the fifth filter is terminated.

18. The directional coupler according to claim 1, wherein the directional coupler comprises a plurality of fourth filters.

19. The directional coupler according to claim 18, further comprising:
a fifth filter having a pass band different from the pass band of the third filter,
wherein a first end of the fifth filter is connected to a path connecting the second end of the sub line to the third filter, and a second end of the fifth filter is terminated.

* * * * *